(12) United States Patent
Jin et al.

(10) Patent No.: US 9,064,631 B2
(45) Date of Patent: Jun. 23, 2015

(54) THROUGH-CHIP INTERFACE (TCI) STRUCTURE FOR WIRELESS CHIP-TO-CHIP COMMUNICATION

(75) Inventors: Jun-De Jin, Hsinchu (TW); Tzu-Jin Yeh, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 720 days.

(21) Appl. No.: 13/350,206

(22) Filed: Jan. 13, 2012

(65) Prior Publication Data
US 2013/0181534 A1    Jul. 18, 2013

(51) Int. Cl.
| H01F 38/14 | (2006.01) |
| H01F 37/00 | (2006.01) |
| H01F 27/28 | (2006.01) |
| H01L 23/522 | (2006.01) |
| H01L 23/64 | (2006.01) |
| H01L 25/065 | (2006.01) |
| H01L 23/48 | (2006.01) |

(52) U.S. Cl.
CPC ............... *H01F 38/14* (2013.01); *H01F 37/00* (2013.01); *H01F 27/2804* (2013.01); *H01L 23/5227* (2013.01); *H01L 23/64* (2013.01); *H01L 25/0657* (2013.01); *H01L 23/48* (2013.01); *H01L 2225/06531* (2013.01); *H01L 2224/32145* (2013.01)

(58) Field of Classification Search
CPC .................................. H01F 37/00; H01F 38/14
USPC ......................................................... 307/104
See application file for complete search history.

(56) References Cited

U.S. PATENT DOCUMENTS

| 8,325,001 B2 * | 12/2012 | Huang et al. ................... 336/200 |
| 2012/0032751 A1 * | 2/2012 | Fukuda et al. .................. 333/32 |
| 2012/0126630 A1 | 5/2012 | Jin et al. |

OTHER PUBLICATIONS

Mizoguchi, D. et al., "A 1.2Gb/s/pin Wireless Superconnect Based on Inductive Inter-Chip Signaling (IIS)", IEEE International Solid-State Circuits Conference, 2004, Session 7, TD: Scaling Trends/7.6, 10 pages.

* cited by examiner

*Primary Examiner* — Hal Kaplan
(74) *Attorney, Agent, or Firm* — Duane Morris LLP (57) ABSTRACT

A transformer for RF and other frequency through-chip-interface (TCI) applications includes multiple chips in wireless electronic communication with one another in three-dimensional integrated circuit, 3DIC, technology. Each of the chips includes an inductor coil and a matching network that matches the impedance of the inductor coil. The matching network is electrically coupled between the inductor coil and further components and circuits formed on the chip.

21 Claims, 6 Drawing Sheets

THROUGH-CHIP INTERFACE (TCI) STRUCTURE FOR WIRELESS CHIP-TO-CHIP COMMUNICATION

TECHNICAL FIELD

The disclosure relates to semiconductor chip-to-chip wireless communication systems.

BACKGROUND

Wireless chip-to-chip communication can be achieved for electronic components using through-chip interface (TCI) communication channels between individual chips disposed in a three-dimensional IC (3DIC) arrangement. In such wireless communication channels, it is desirable to attain a high coupling coefficient, k, between the individual chips that act as transformers and are in wireless communication with one another. Achieving a high coupling coefficient, k, in transformers for RF and other chip-to-chip wireless communication systems, is useful for increasing sensitivity and reducing power consumption.

Attempts at improving the coupling coefficient have been primarily geared to making physical changes to the chips and typically render the chips difficult to handle or require more extensive structures that require additional space, and are difficult to produce. Previous attempts have also not been very efficient at enhancing the coupling coefficient.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

The disclosure is related to a high coupling efficient, k, transformer for RF through-chip-interface (TCI) applications. TCI systems involve two chips in electronic communication through wireless channels and therefore act as a transformer. Inductors are commonly used for such wireless communication, for example when the electromagnetic radiation used for communication is in the radio frequency, RF, range. Inductor structures are typically referred to as inductor coils that include a winding or spiral conductive material disposed in dielectric materials formed over a substrate.

Figure 1:
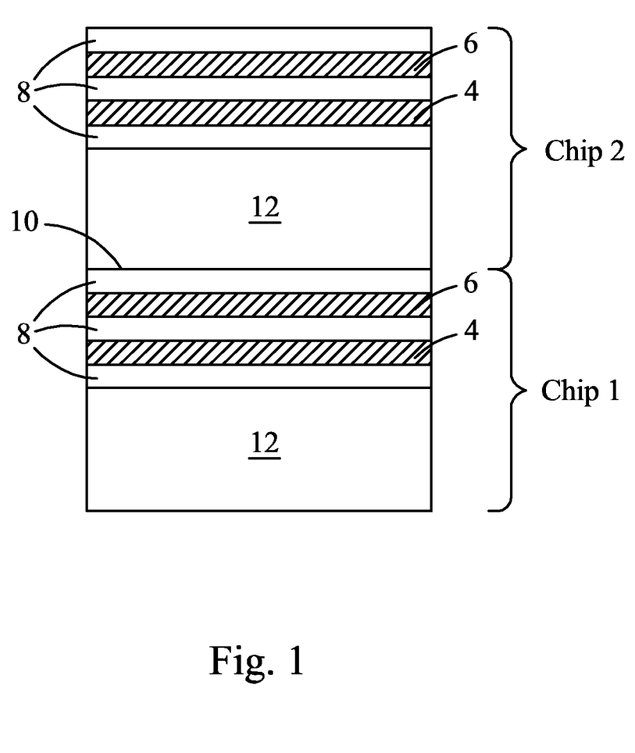
FIG. 1 is an embodiment of a cross-sectional view of portions of an exemplary TCI structure with two stacked chips.
Figure 2:
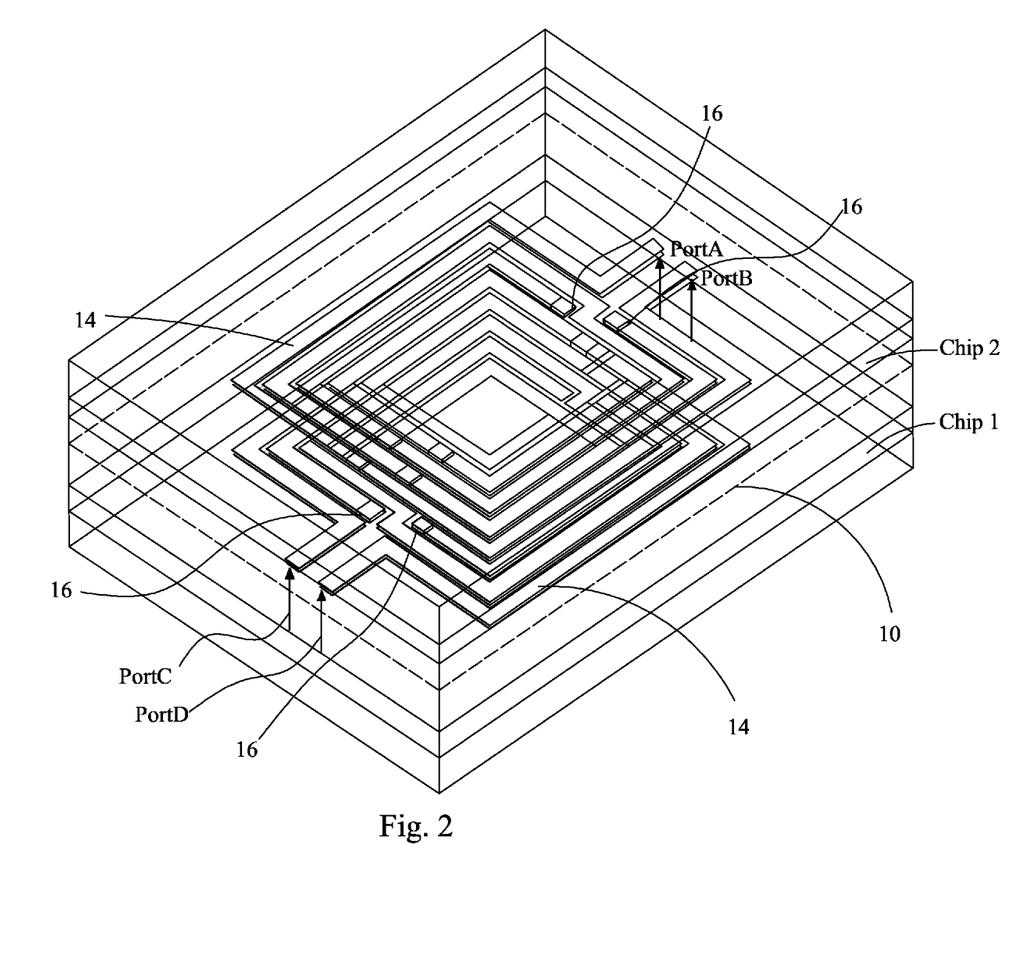
FIG. 2 is an embodiment of a perspective three-dimensional view of portions of two exemplary stacked chips forming a TCI structure.

FIGS. 1 and 2 illustrate portions of two stacked chips with exemplary inductors formed on the chips. FIG. 1 shows chip 2 disposed over chip 1. Each of chip 1 and 2 includes substrate 12 and an inductor coil formed of multiple conductive layers coupled together. The multiple conductive layers include lower conductive layer 4 and upper conductive layer 6 formed within dielectric 8. Dielectric 8 may be silicon dioxide or other suitable dielectric materials. The conductive materials used in lower conductive layer 4 and upper conductive layer 6 may be suitable metals such as copper or aluminum or other suitable conductive materials. Substrate 12 is formed of silicon, or other suitable materials such as glass, GaAs or other suitable III-V substrate materials in various embodiments. Chip 2 is directly stacked on chip 1, i.e. chip 1 and chip 2 share common interface 10.

FIG. 2 is a three-dimensional, perspective view of two stacked chips, a portion of which was shown in cross-section in FIG. 1. Chip 2 is disposed over chip 1 such that they share common interface 10. Chip 2 includes inductor coil 14 which includes at least two metal layers. In the embodiment illustrated in FIG. 2, vias 16 couple the two metal layers that form inductor coil 14. Although two metal layers are illustrated in FIGS. 1 and 2, inductor coils 14 are formed of additional metal layers in other exemplary embodiments. Chip 1 also includes inductor coil 14 formed of multiple metal layers such as are connected by exemplary via 16. Although inductor coils 14 form a spiral that has a generally square footprint in the illustrated embodiment, such is intended to be exemplary only. The diameter across inductor coil 14 may be various sizes in various embodiments. In one embodiment, the diameter is about 50 microns×50 microns and the diameter is about 125 microns×125 microns in another exemplary embodiment. Other dimensions may be utilized in other embodiments. Inductor coil 14 of chip 2 includes port A and port B to be coupled to other components and inductor coil 14 of chip 1 includes port C and port D for coupling to other electronic components. The positioning of ports A and B opposite ports C and D is exemplary.

Figure 3:
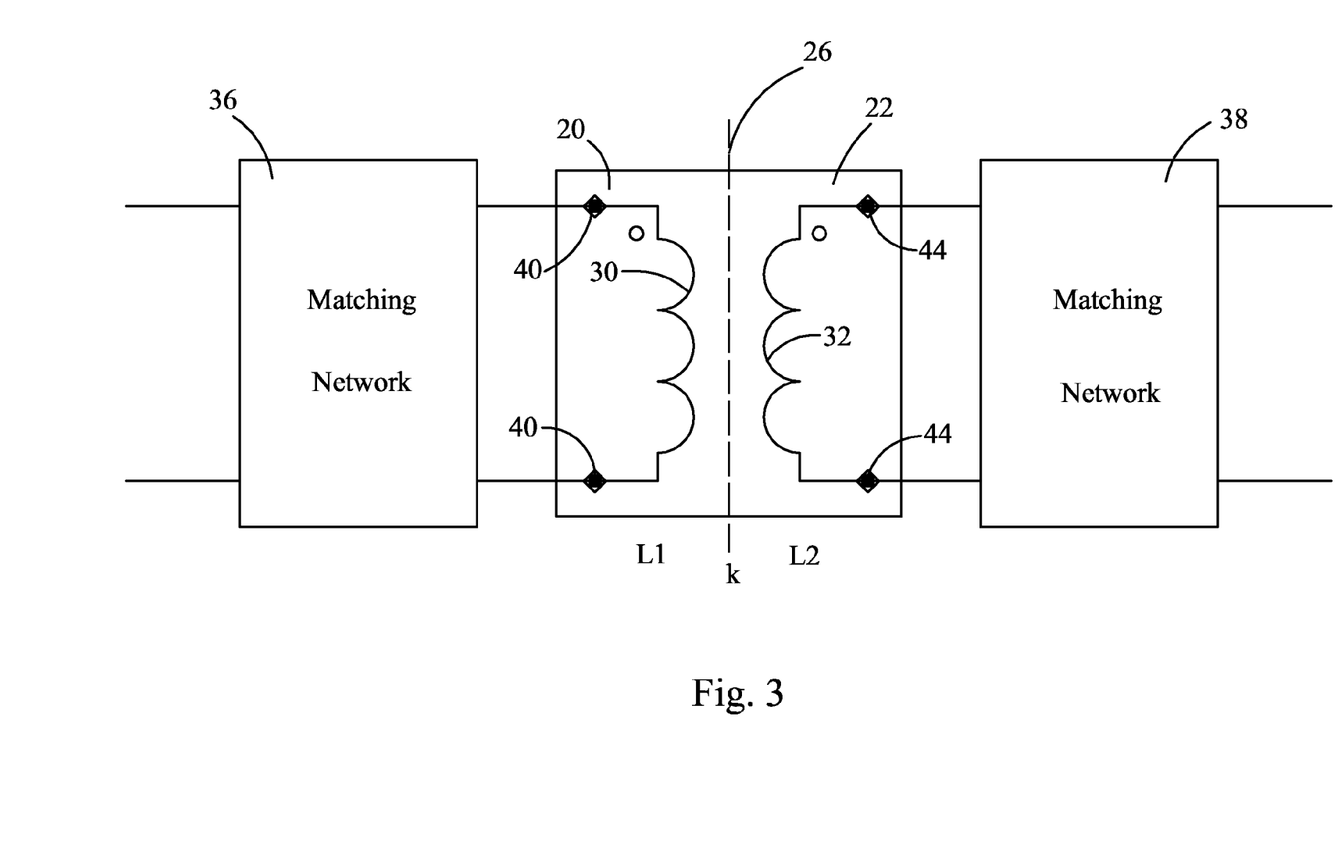
FIG. 3 is a diagram schematically showing an exemplary TCI system according to an embodiment of the disclosure.
Figure 4A:
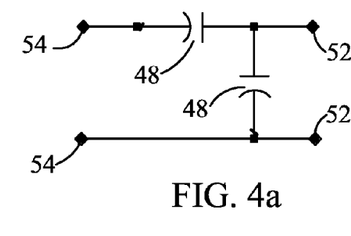
FIGS. 4a-4h are circuit diagrams illustrating exemplary matching networks according to some embodiments of the disclosure.
Figure 4B:
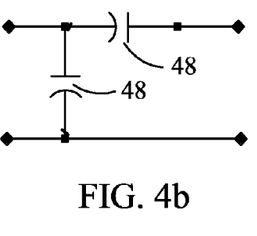
Figure 4C:
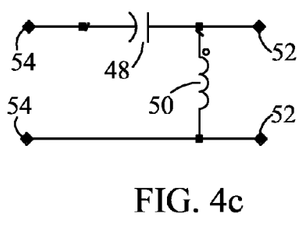
Figure 4D:
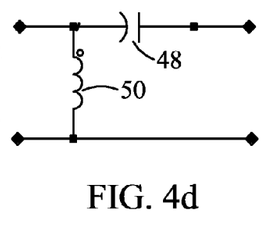
Figure 4E:
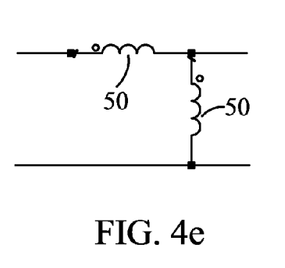
Figure 4F:
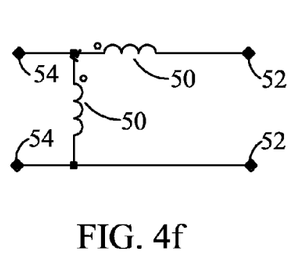
Figure 4G:
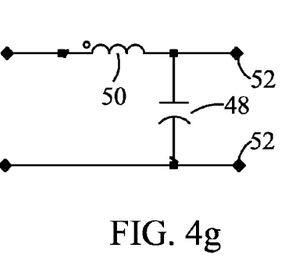
Figure 4H:
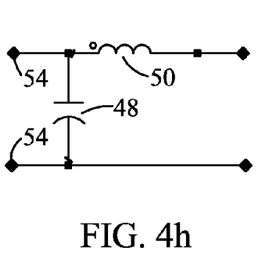

FIG. 3 is a schematic illustration showing aspects of the disclosure. Chips 20 and 22 share common boundary 26. In one exemplary embodiment, chips 20 and 22 are stacked over one another. Chip 20 includes inductor coil 30 with inductance L1 and chip 22 includes inductor coil 32 with inductance L2. Inductor coils 30 and 32 are shown schematically in FIG. 3. In one embodiment, inductor coils 30 and 32 take on the shape and dimensions of inductor coils 14 described in FIG. 2. In other embodiments, inductor coils 30 and 32 take on various other shapes and configurations. Chip 20 and inductor coil 30 are coupled to corresponding matching network 36 and chip 22 and inductor coil 32 are coupled to corresponding matching network 38. Exemplary embodiments of matching networks 36 and 38 will be shown below. Matching network 36 is coupled to and across opposed terminals 40 of inductor coil 30 and matching network 38 is coupled to and across opposed terminals 44 of inductor coil 32. The system of the two chips 20, 22 in contact with one another and each including an inductor coil with an impedance matching network, form a through-chip-interface (TCI) system and may also be considered a transformer. Chips 20 and 22 are in wireless communication with one another by virtue of the electromagnetic radiation produced by the respective inductor coils 30, 32. Chips 20 and 22 may each serve as transmitters and receivers of RF or other frequency electromagnetic radiation.

FIG. 3 is shown in schematic representation. In various embodiments, the corresponding matching networks 36, 38 are formed on the same substrate as their corresponding inductor coils 30, 32 although not illustrated in the schematic of FIG. 3. Matching network 36 provides for impedance matching of inductor coil 30 with inductance L1 and matching network 38 provides for impedance matching of inductor coil 32 with inductance L2. In one embodiment, inductances L1, L2 are the same. In other exemplary embodiments, inductances L1, L2 differ from one another. Matching networks 36 and 38 match the impedance of corresponding inductor coils 30, 32. Impedance is similar to resistance but extends the concept of resistance to alternating current (AC) circuits, describing not only the relative amplitudes of the voltage and current, but also the relative phases as impedance is a measure of opposition to alternating current. In some embodiments, the use of matching networks to match the impedance of the corresponding inductor coils enhances the coupling coefficient, k, and provides for more efficient wireless communication between the respective chips and enables lower power to be used. In one exemplary embodiment at 2.5 GHz, the coupling coefficient was enhanced by 460%, i.e. k at 2.5 GHz for an inductor coil having a footprint diameter of 50×50 um² was increased from 0.20 to 0.92. This provides the corollary advantage that, for a given k value, the inductor area can be reduced and still deliver the same wireless signal strength. The foregoing example is intended to be exemplary and illustrative of an advantage of the disclosure which provides for an increased coupling coefficient and increased wireless communication efficiency between chips.

FIGS. 4a-4h are circuit diagrams showing exemplary matching networks according to some embodiments of the disclosure. The matching networks include capacitors 48 and inductors 50 in various arrangements, according to various exemplary embodiments. Capacitors 48 are representative of various capacitive devices in various exemplary embodiments, i.e. passive two-terminal electrical components used to store energy in an electric field, and are referred to, collectively throughout the disclosure as capacitors 48. Inductors 50 are representative of various types of inductive devices in various exemplary embodiments. Inductive devices are passive to terminal electrical components used to store energy in a magnetic field and are referred to collectively, throughout the disclosure as inductors 50. The matching networks include opposed terminals 52 which are adapted to be coupled to terminals 40 of inductor coil 30 or to terminals 44 of inductor coil 32 (see FIG. 3). According to the exemplary matching network shown in FIG. 4g, with terminals 52 coupled to respective terminals 40, capacitor 48 is coupled across inductor coil 30 and in FIG. 4c, when terminals 52 are coupled to respective terminals 40, inductor 50 is disposed across terminals 40 of inductor coil 30. In other embodiments, terminals 54 are coupled to further components and various circuits, as will be shown below. As such, the respective exemplary matching networks shown in FIGS. 4a-4h are coupled between the respective inductor coil and further components and circuits that may be disposed on the same or a different chip as their respective inductor coils.

Each of the exemplary matching networks illustrated in FIGS. 4a-4h represents a second order matching network, i.e. a matching network with two components. The matching networks illustrated in FIGS. 4a-4h are intended to be exemplary, not limiting of the various matching networks that may be used. According to other embodiments, third or greater order matching networks are used. According to still other embodiments, either or both of the illustrated components, i.e. capacitor 48 and inductor 50, may be replaced by a suitably sized transmission line. In one embodiment, a suitably wide transmission line is used as a capacitive device. In another embodiment, a suitably narrow transmission line is used as an inductive device. The relative widths of the transmission lines are relative terms, e.g. a relatively wide transmission line is used as a capacitive device. The exact line width will depend on various factors such as but not limited to metal thickness, substrate thickness, dielectric constant, and operating frequency. In one embodiment, the relatively wide transmission line being used as a capacitive device may be at least 1.5 times as wide as standard wiring and may be larger than about 7.5 microns in one embodiment. According to an embodiment in which a relatively narrow transmission line serves as an inductive device, the transmission line may include a thickness no greater than 0.8 times the thickness of the standard wiring and may be less than about 4 microns in one embodiment in which the width of standard wiring is about 5 microns. According to one embodiment, the relatively wide transmission line used as a capacitive device is at least two times as wide as the relatively narrow transmission line used as an inductive device in the matching network, but other relative widths are used in other embodiments.

Figure 5:
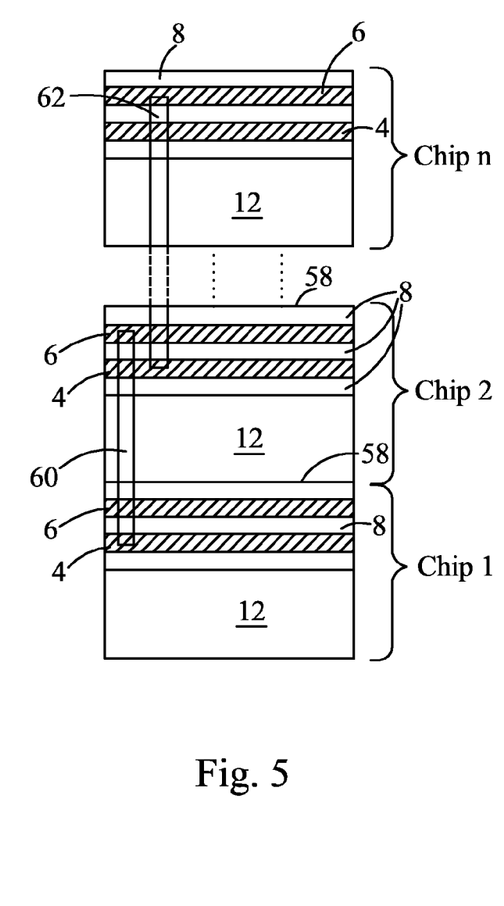
FIG. 5 shows an embodiment of an exemplary TCI system with a plurality of stacked chips according to the disclosure.

FIG. 5 is a cross-sectional view showing portions of stacked chips that each include inductor coils as previously described. The stack of chips includes multiple chips stacked over one another in various embodiments. FIG. 5 shows chip 2 stacked directly on chip 1 and chip "n" represents that a number of additional chips may also be stacked over chips 1 and 2. Although the respective chips are shown stacked in the same orientation, top-to-bottom, in other embodiments the chips are stacked with respective upper dielectric surfaces 58 in direct or indirect contact with one another. Each chip illustrated in FIG. 5 represents a small cross-section of a chip that additionally includes a matching network and additional components. TCI structures 60 and 62 are shown schematically in FIG. 5 to represent one chip wirelessly communicating with another chip. TCI structure 60 schematically shows chip 1 in wireless communication with chip 2. In one embodiment, each of the stacked chips is in wireless communication with an adjacent chip, forming a TCI structure.

Although FIGS. 1, 2, and 5 illustrate one inductor coil per chip, in other exemplary embodiments, a single chip may include more than one inductor coil formed on a common substrate. According to such exemplary embodiments, the inductor coils are advantageously spaced on the common substrate such that the pitch between centers of adjacent inductor coils exceeds the diameter of the inductor coil. This is also true when inductor coils formed on separate chips are assembled in close proximity to one another. According to the embodiment in which a single chip includes multiple inductor coils, two additional chips each including an inductor coil may be each stacked directly on the chip with two inductor coils, such that respective inductor coils are disposed over one another and such that the two superjacent chips are disposed laterally with respect to one another.

Figure 6:
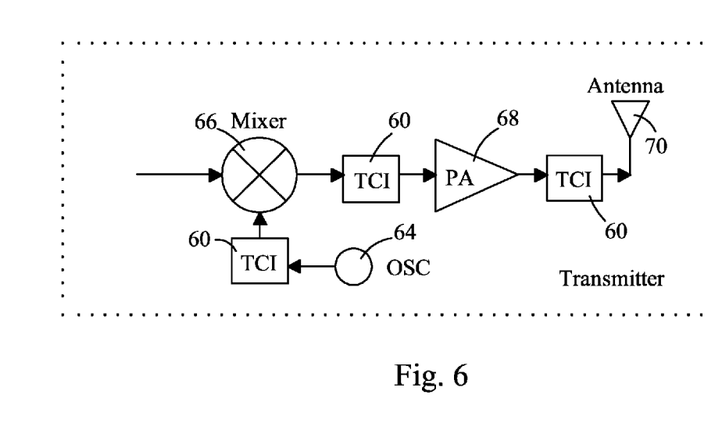
FIG. 6 is a circuit diagram showing an exemplary transmitter circuit utilizing TCI systems according to an embodiment of the disclosure.
Figure 7:
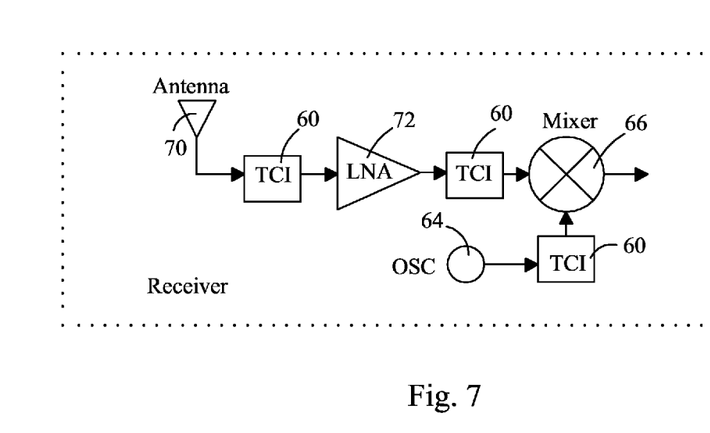
FIG. 7 is a circuit diagram showing an exemplary receiver circuit utilizing TCI systems according to an embodiment of the disclosure.

FIGS. 6 and 7 show exemplary networks in which the TCI structures in various embodiments of the disclosure may be used. FIG. 6 is an exemplary circuit showing an RF transmitter. FIG. 7 is an exemplary circuit showing an RF receiver, and each of the exemplary circuits utilize TCI structures 60 such as previously described and illustrated. The transmitter circuit of FIG. 6 includes oscillator 64, mixer 66, power amplifier 68 and antenna 70. The receiver circuit of FIG. 7 includes oscillator 64, mixer 66, low-noise amplifier 72 and antenna 70. Each exemplary circuit includes three TCI structures 60 in the illustrated exemplary embodiments. Each TCI structure 60 includes two inductor circuits, each including an inductor and corresponding matching network, the inductor circuits formed on two different chips and in wireless communication with one another. Each TCI structure 60 therefore includes two chips in this embodiment. The other components such as mixer 66, oscillator 64, power amplifier 68 and antenna 70 may be formed on either of the chips of TCI structure 60. In one exemplary embodiment, one of the chips of TCI structure 60 includes the antenna and power amplifier and the other of the two chips includes antenna 70 and oscillator 64, with each chip also including an inductor coil and corresponding matching network. This is intended to be exemplary. In other embodiments, either of the chips that combine to form TCI structure 60 may include any or all of the illustrated components as well as other components.

According to one embodiment, a semiconductor device for wireless chip-to-chip communication is provided. The semiconductor device includes an inductor coil formed of at least two metal layers in a dielectric material over a substrate and a matching network coupled to the inductor coil. The matching network is at least a second order matching network.

In another embodiment, a through-chip-interface (TCI) structure is provided. The through-chip-interface (TCI) structure includes at least two chips in contact with one another, each chip comprising at least one inductor coil formed of at least two metal layers disposed in a dielectric material formed over a substrate and a matching network formed over the substrate and coupled to the inductor coil. The matching network is at least a second order matching network and the at least two chips are in wireless electronic communication with one another.

In another embodiment, a wireless circuit is provided. The wireless circuit includes a plurality of TCI structures, an oscillator, an amplifier and a mixer. Each TCI structure comprises two inductor circuits formed on separate chips that share a common boundary and are in wireless electronic communication with one another. Each inductor circuit comprises an inductor coil and a matching network. The inductor coil is formed of multiple metal coils disposed in a dielectric disposed on a substrate and the matching network is further disposed on the substrate.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A semiconductor device for wireless chip-to-chip communication, said semiconductor device comprising:
    an inductor coil formed of at least two metal layers in a dielectric material on a substrate; and
    a matching network coupled to said inductor coil, said matching network being at least a second order matching network,
    wherein said matching network is formed on said substrate and said matching network is coupled between said inductor coil and additional components disposed on said substrate.

2. The semiconductor device as in claim 1, wherein said matching network provides substantially the same impedance as said inductor coil.

3. The semiconductor device as in claim 1, wherein said matching network comprises at least two capacitive devices or at least two inductive devices.

4. The semiconductor device as in claim 1, wherein said matching network comprises at least one capacitive device and at least one inductive device.

5. The semiconductor device as in claim 4, wherein said at least one capacitive device is formed of a first transmission line, said at least one inductive device is formed of a second transmission line, said first transmission line being at least about two times as wide as said second transmission line, and
    wherein said matching network further comprises at least one further capacitive device or at least one further inductive device.

6. The semiconductor device as in claim 4, wherein said matching network includes a first capacitive device of said at least one capacitive device, and said first capacitive device is coupled across terminals of said inductor coil.

7. The semiconductor device as in claim 4, wherein said matching network comprises a first inductive device of said at least one inductive device and said first inductive device is coupled across terminals of said inductor coil.

8. A through-chip interface (TCI) structure comprising:
    at least two chips in contact with one another, each chip of said at least two chips comprising at least one inductor coil formed in a dielectric material formed over a substrate and a matching network formed over said substrate, said at least one inductor coil including at least two metal layers and said matching network coupled to said at least one inductor coil and being at least a second order matching network;
    said at least two chips in wireless electronic communication with one another.

9. The TCI structure as in claim 8, wherein said at least two chips includes a first chip adapted to generate RF electromagnetic radiation and a second chip adapted to receive said RF electromagnetic radiation.

10. The TCI structure as in claim 8, wherein said substrate comprises one of silicon, glass, GaAs and a III-V material and said at least two chips comprise two chips that are stacked such that respective dielectric surfaces of said two chips share a common boundary.

11. The TCI structure as in claim 8, wherein said at least two chips include
a first chip with first and second inductor coils of said at least one inductor coil formed on said first chip and wherein said first and second inductor coils are spaced from one another such that a pitch between said first and second inductor coils is greater than a diameter of said first inductor coil and greater than a diameter of said second inductor coil;
a second chip with a third inductor coil of said at least one inductor coil positioned over said first inductor coil; and
a third chip with a fourth inductor coil of said at least one inductor coil positioned over a second inductor coil of said at least one inductor coil.

12. The TCI structure as in claim 8, wherein said matching network provides substantially the same impedance as said at least one inductor coil and comprises at least two capacitive devices or at least two inductive devices.

13. The TCI structure as in claim 8, wherein said matching network comprises at least one capacitive device and at least one inductive device.

14. The TCI structure as in claim 13, wherein said matching network comprises a first device being a first capacitive device of said at least one capacitive device or a first inductive device of said at least one inductive device, said first device coupled across terminals of said inductor coil and wherein said matching network is coupled between said inductor coil and further components disposed on said substrate.

15. The TCI structure as in claim 13, wherein said matching network comprises at least a first inductive device of said at least one inductive device formed of a first transmission line and at least a first capacitive device of said at least one capacitive device formed of a second transmission line, wherein said second transmission line is at least about two times as wide as said first transmission line.

16. A wireless circuit comprising:
a plurality of through-chip interface (TCI) structures, each including two inductor circuits formed on separate chips that share a common boundary and that are in wireless electronic communication with one another, each said inductor circuit comprising an inductor coil and a matching network, said inductor coil formed of multiple metal coils disposed in a dielectric disposed on a substrate and said matching network further disposed on said substrate; and
an oscillator, an amplifier, and a mixer, wherein each of said oscillator, amplifier and mixer is directly or indirectly coupled to said TCI structures.

17. The wireless circuit as in claim 16, wherein
said amplifier comprises a power amplifier; and
said wireless circuit includes
a first TCI structure of said plurality of TCI structures that is coupled between said oscillator and said mixer,
a second TCI structure of said plurality of TCI structures that is coupled between said mixer and said power amplifier, and
a third TCI structure of said plurality of TCI structures that is coupled between said power amplifier and an antenna.

18. The wireless circuit as in claim 17,
wherein said first TCI structure includes
a first inductor circuit of said two inductor circuits, said first inductor circuit formed on a first chip, and
a second inductor circuit of said two inductor circuits, said second inductor circuit formed on a second chip, and
wherein said oscillator is formed on said first chip and said mixer is formed on said second chip.

19. The wireless circuit as in claim 16, wherein said amplifier comprises a low noise amplifier and said wireless circuit includes first, second and third TCI structures of said plurality of TCI structures, said first TCI structure coupled between said oscillator and said mixer, said second TCI structure coupled between said mixer and said low noise amplifier and said third TCI structure coupled between said low noise amplifier and an antenna.

20. The wireless circuit as in claim 16, wherein said plurality of TCI structures comprises at least three said chips of said chips, said at least three chips stacked over one another, at least adjacent ones of said chips comprising one TCI structure of said plurality of TCI structures.

21. A semiconductor device for wireless chip-to-chip communication, said semiconductor device comprising:
an inductor coil formed of at least two metal layers in a dielectric material on a substrate and including a plurality of rectangles having a common center in at least one of said metal layers; and
a matching network coupled to said inductor coil, said matching network being at least a second order matching network.

* * * * *